United States Patent
Clark et al.

(10) Patent No.: US 10,647,056 B2
(45) Date of Patent: May 12, 2020

(54) METHOD OF ADDITIVE MANUFACTURING USING PHOTOREGULATED RADICAL POLYMERIZATION

(71) Applicant: Dow Global Technologies LLC, Midland, MI (US)

(72) Inventors: Paul Clark, Midland, MI (US); John W. Kramer, Midland, MI (US); Aleksander J. Pyzik, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 143 days.

(21) Appl. No.: 15/549,272

(22) PCT Filed: Feb. 29, 2016

(86) PCT No.: PCT/US2016/020102
§ 371 (c)(1),
(2) Date: Aug. 7, 2017

(87) PCT Pub. No.: WO2016/148890
PCT Pub. Date: Sep. 22, 2016

(65) Prior Publication Data
US 2018/0036942 A1 Feb. 8, 2018

Related U.S. Application Data

(60) Provisional application No. 62/135,212, filed on Mar. 19, 2015.

(51) Int. Cl.
| | |
|---|---|
| *B29C 64/135* | (2017.01) |
| *B33Y 70/00* | (2020.01) |
| *G03F 7/00* | (2006.01) |
| *G03F 7/029* | (2006.01) |
| *G03F 7/031* | (2006.01) |
| *G03F 7/027* | (2006.01) |

(52) U.S. Cl.
CPC ............ *B29C 64/135* (2017.08); *B33Y 70/00* (2014.12); *G03F 7/0037* (2013.01); *G03F 7/027* (2013.01); *G03F 7/029* (2013.01); *G03F 7/031* (2013.01)

(58) Field of Classification Search
CPC ....... B29C 64/135; G03F 7/031; G03F 7/029; G03F 7/027; G03F 7/0037; B33Y 70/00
See application file for complete search history.

(56) References Cited

U.S. PATENT DOCUMENTS

| | | | | |
|---|---|---|---|---|
| 6,099,787 | A * | 8/2000 | Melisaris | C08K 5/17 264/401 |
| 6,458,509 | B1 * | 10/2002 | Haruta | G03F 7/027 430/18 |
| 6,989,225 | B2 | 1/2006 | Steinmann | |
| 7,514,477 | B2 | 4/2009 | Klare et al. | |
| 9,081,283 | B2 | 7/2015 | Hawker et al. | |
| 2004/0013977 | A1 * | 1/2004 | Steinmann | G03F 7/0037 430/280.1 |
| 2006/0234154 | A1 * | 10/2006 | Nishimura | G03F 7/0046 430/270.1 |
| 2009/0068595 | A1 * | 3/2009 | Hirakawa | G03F 7/027 430/286.1 |
| 2012/0259031 | A1 | 10/2012 | Dake et al. | |
| 2017/0145121 | A1 * | 5/2017 | Kanehara | C07C 323/32 |
| 2019/0155153 | A1 * | 5/2019 | Qian | C07D 295/104 |
| 2019/0201171 | A1 * | 7/2019 | Raia | B33Y 70/00 |

FOREIGN PATENT DOCUMENTS

| | | |
|---|---|---|
| EP | 2636511 | 9/2013 |
| WO | 9630182 | 10/1996 |
| WO | 9836323 | 8/1998 |
| WO | 2016036976 | 3/2016 |

OTHER PUBLICATIONS

Wang, X.; Cai. X; Guo. Q.; Zhang, T.; Kobe, B.; Yang, J. "i3DP, a robust 3D printing approach enabling genetic post-printing surface modification", Chem. Commun. 2013, 49, 10064-10066.

Guo, Q.; Cai, X; Wang, X.; Yang, J. "'Paintable' 3D printed structures via a post-ATRP process with antimicrobial function for biomedical applications", J. Mater. Chem. B 2013, 1, 6644-6649.

Wang, X.; Guo, Q.; Cai, X.; Zhou, S.; Kobe, B.; Yang, J. "Initiator-Integrated 3D Printing Enables the Formation of Complex Metallic Architectures", ACS Appl. Mater. Interfaces 2014, 6, 2583-2587.

Hao, F.; Liu, Z; Zhang, M.; Liu, J.; Zhang, S.; Wu, J.; Zhou, H.; Tian, Y. Spectrochim Acta A: Molec Biomolec "Four new two-photon polymerization initiators with varying donor and conjugated bridge: Synthesis and two-photon activity", Spectroscopy 2014, 118, 538-542.

Shawn B. Brueggemeier et al: 11 Protein-Acrylamide Copolymer Hydrogels for Array-Based Detection of Tyrosine Kinase Activity from Cell Lysates , Biomac Romo Lecu Les, vol. 6, No. 5, Sep. 1, 2005 (Sep. 1, 2005), pp. 2765-2775.

Zaza Gomurashvili et al: "Phenothiazine photosensitizers for onium salt photoinitiated cationic polymerization", Journal of Polymer Science Part A: Polymer Chemistry, Apr. 15, 2001 (Apr. 15, 2001), pp. 1187-1197.

James V. Crivello et al: "Development of Pyrene Photosensitizers for Cationic Photopolymerizations", Chemistry Of Materials, vol. 14, No. 11, Nov. 1, 2002 (Nov. 1, 2002), pp. 4858-4866.

* cited by examiner

Primary Examiner — Nahida Sultana

(57) ABSTRACT

A method of fabricating a three-dimensional object, the method comprising: combining at least one of a meth (acrylate), a (meth)acrylamide, a (meth)acrylonitrile, a styrene, an acrylonitrile, a vinyl acetate, a vinylcarbazole, a vinylpyridine, a vinyl ether, a vinyl chloride monomers, a polyfunctional monomer, and a polyfunctional prepolymer with an organic photoredox catalyst to provide a reaction mixture; depositing the reaction mixture; polymerizing the monomers by irradiating the reaction mixture with a light source; and repeating the depositing step until the three-dimensional object is formed.

3 Claims, No Drawings

METHOD OF ADDITIVE MANUFACTURING USING PHOTOREGULATED RADICAL POLYMERIZATION

BACKGROUND

The present disclosure relates to additive manufacturing and in particular to a method of fabricating objects via additive manufacturing using photoredox catalysts to achieve metal free photoregulated radical polymerization.

Additive manufacturing is generally a process in which three-dimensional (3D) objects are fabricated based on computer models of the objects. These processes are used in various fields, such as design-related fields for purposes of visualization, demonstration and mechanical prototyping.

3D printing is one example of additive manufacturing. Methods of 3D printing include fused deposition modeling (FDM) and selective laser sintering (SLS). The materials used in 3D printing have typically been polymers; common examples include acrylonitrile butadiene styrene (ABS), polylactic acid (PLA), polyamides, polyether ether ketone (PEEK) and thermoplastic polyurethane (TPU).

There are many factors to consider when selecting a 3D printing method and building material, for example, the melt flow rate of the polymer and the solid state properties of the fabricated object.

In FDM, molten polymer filament is extruded from an extrusion nozzle to build the fabricated article layer by layer. The important requirements for the polymer when used in SLS are: good melt flow rates, relatively low melting temperature, good adhesion and good mechanical properties after cooling. ABS is currently the standard material for most applications, however, ABS derived articles made via additive manufacturing suffer from poor physical properties, at least in part because these parts are effectively formed from tens to hundreds of weld lines and ABS weld lines are known to have poor physical properties. Also, fabricating with ABS involves formation of fumes, requiring a well-ventilated area.

In SLS, polymer powder, for example polyamide, TPU, or PEEK, is used. The powder is melted during the sintering process, and the viscosity of the melt and the crystallization temperature can cause the fabricated article to become warped. Further, weak bonding, moisture absorption, and low powder recyclability have been cited as drawbacks of SLS using known polymer feed stocks. Adding additives, such as fillers, has been attempted to address these drawbacks, but this has been met with limited success due to the high viscosity of the polymers—high viscosity prevents uniform loading of the additives to the polymer.

An improved additive manufacturing process is desired to produce fabricated articles having good solid state properties. A method of fabricating objects via additive manufacturing using photoredox catalysts to achieve metal free photoregulated radical polymerization is desired.

SUMMARY

A method of fabricating a three-dimensional object, the method comprising: combining at least one of a meth (acrylate), a (meth)acrylamide, a (meth)acrylonitrile, a styrene, an acrylonitrile, a vinyl acetate, a vinylcarbazole, a vinylpyridine, a vinyl ether, a vinyl chloride monomers, a polyfunctional monomer, and a polyfunctional prepolymer with an organic photoredox catalyst to provide a reaction mixture; depositing the reaction mixture; polymerizing the monomers by irradiating the reaction mixture with a light source; and repeating the depositing step until the three-dimensional object is formed.

DETAILED DESCRIPTION

The present disclosure relates to additive manufacturing in general, and in particular to a method of using photoredox catalysts to achieve metal free photoregulated radical polymerization for producing fabricated articles.

Throughout this specification, unless the context requires otherwise, the word "comprise" and "include" and variations (e.g., "comprises," "comprising," "includes," "including") will be understood to imply the inclusion of a stated component, feature, element, or step or group of components, features, elements or steps but not the exclusion of any other integer or step or group of integers or steps.

As used in the specification and the appended claims, the singular forms "a," "an" and "the" include plural referents unless the context clearly dictates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein the term "combining" includes adding one or more items to a reaction mixture.

As used herein the term "dispersity," "polydispersity," "polydispersity index", "PDI," and "Mw/Mn" are used interchangeably and refer to measures of the polymer uniformity with respect to distribution of molecular mass. The dispersity may be calculated by dividing weight average molecular weight (Mw) by the number average molecular weight (Mn) (i.e., Mw/Mn). In certain embodiments, the dispersity may be calculated according to degree of polymerization, where the dispersity equals Xw/Xn, where Xw is the weight-average degree of polymerization and Xn is the number-average degree of polymerization.

All percentages, ratios and proportions herein are by weight, unless otherwise specified. A weight percent (weight %, also as wt %) of a component, unless specifically stated to the contrary, is based on the total weight of the composition in which the component is included (e.g., on the total amount of the reaction mixture).

The term "alkoxy" as used herein, means an alkyl group, as defined herein, appended to the parent molecular moiety through an oxygen atom. Representative examples of alkoxy include, but are not limited to, methoxy, ethoxy, propoxy, 2-propoxy, butoxy, tert-butoxy, pentyloxy, and hexyloxy.

The term "alkyl" as used herein, means a straight or branched chain hydrocarbon containing from 1 to 20 carbon atoms unless otherwise specified. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. The term "alkylene" refers to a divalent alkyl group, where alkyl is as defined herein.

The term "aryl," as used herein, means a phenyl (i.e., monocyclic aryl), or a bicyclic ring system containing at least one phenyl ring or an aromatic bicyclic ring containing only carbon atoms in the aromatic bicyclic ring system, or a polycyclic ring system containing at least one phenyl ring.

The bicyclic aryl can be azulenyl, naphthyl, or a phenyl fused to a cycloalkyl, a cycloalkenyl, or a heterocyclyl. The bicyclic or polycyclic aryl is attached to the parent molecular moiety through any carbon atom contained within the phenyl portion of the bicyclic or polycyclic system, or any carbon atom with the napthyl, azulenyl, anthracene, or pyrene ring.

The term "aryloxy" as used herein, means an aryl group, as defined herein, appended to the parent molecular moiety through an oxygen atom. Representative examples of aryloxy include, but are not limited to, phenyloxy and naphthoxy.

The term "cycloalkyl" refers to a monocyclic or a bicyclic cycloalkyl ring system. Monocyclic ring systems are cyclic hydrocarbon groups containing from 3 to 8 carbon atoms, where such groups can be saturated or unsaturated, but not aromatic. Examples of cycloalkyl include cyclopropyl, cyclobutyl, cyclopentyl, cyclohexyl, cycloheptyl and cyclooctyl. More preferred are $C_3$-$C_6$ cycloalkyl groups. In certain embodiments, cycloalkyl groups are fully saturated. Examples of monocyclic cycloalkyls include cyclopropyl, cyclobutyl, cyclopentyl, cyclopentenyl, cyclohexyl, cyclohexenyl, cycloheptyl, and cyclooctyl. Bicyclic cycloalkyl ring systems are bridged monocyclic rings or fused bicyclic rings. Bridged monocyclic rings contain a monocyclic cycloalkyl ring where two non-adjacent carbon atoms of the monocyclic ring are linked by an alkylene bridge of between one and three additional carbon atoms (i.e., a bridging group of the form —$(CH_2)_w$—, where w is 1, 2, or 3). Representative examples of bicyclic ring systems include, but are not limited to, bicyclo[3.1.1]heptane, bicyclo[2.2.1]heptane, bicyclo[2.2.2]octane, bicyclo[3.2.2]nonane, bicyclo[3.3.1]nonane, and bicyclo[4.2.1]nonane. Fused bicyclic cycloalkyl ring systems contain a monocyclic cycloalkyl ring fused to either a phenyl, a monocyclic cycloalkyl, a monocyclic cycloalkenyl, a monocyclic heterocyclyl, or a monocyclic heteroaryl. The bridged or fused bicyclic cycloalkyl is attached to the parent molecular moiety through any carbon atom contained within the monocyclic cycloalkyl ring.

The term "halogen" as used herein, means —Cl, —Br, —I or —F.

The term "haloalkoxy" refers to an alkoxy group substituted with one or more halogen atoms, where each halogen is independently F, Cl, Br or I. "Haloalkoxy" includes perhaloalkoxy groups, such as $OCF_3$ or $OCF_2CF_3$.

The term "haloalkyl" refers to an alkyl group substituted with one or more halogen atoms, where each halogen is independently F, Cl, Br or I.

The term "heteroaryl," as used herein, means a monocyclic heteroaryl or a bicyclic or polycyclic ring system containing at least one heteroaromatic ring. The monocyclic heteroaryl can be a 5 or 6 membered ring. The 5 membered ring consists of two double bonds and one, two, three or four nitrogen atoms and optionally one oxygen or sulfur atom. The 6 membered ring consists of three double bonds and one, two, three or four nitrogen atoms. The 5 or 6 membered heteroaryl is connected to the parent molecular moiety through any carbon atom or any nitrogen atom contained within the heteroaryl. The bicyclic or polycyclic heteroaryl consists of a heteroaryl fused to a phenyl, a cycloalkyl, a cycloalkenyl, a heterocyclyl, or a heteroaryl. Representative examples of heteroaryl include, but are not limited to, furyl, imidazolyl, isoxazolyl, isothiazolyl, oxadiazolyl, oxazolyl, pyridinyl, pyridazinyl, pyrimidinyl, pyrazinyl, pyrazolyl, pyrrolyl, tetrazolyl, thiadiazolyl, thiazolyl, thienyl, triazolyl, triazinyl, benzimidazolyl, benzofuranyl, benzothienyl, benzoxadiazolyl, benzoxathiadiazolyl, benzothiazolyl, cinnolinyl, 5,6-dihydroquinolin-2-yl, 5,6-dihydroisoquinolin-1-yl, furopyridinyl, indazolyl, indolyl, isoquinolinyl, naphthyridinyl, quinolinyl, or purinyl.

As used herein, the term "polymer" refers to a molecule formed from one or more monomers.

The term "viscosity" means zero shear viscosity unless specified otherwise.

In the photoregulated radical polymerization processes of the disclosure, a catalyst that can undergo oxidative quenching (electron donor) is needed in order to gain control over the chain-growth process. Therefore, the disclosure provides methods additive manufacturing which includes preparing polymer compositions by combining one or more monomers with an initiator and an organic photoredox catalyst that is reducing in an excited state. By the term "reducing in an excited state" is meant a catalyst that is capable of a single electron transfer event in an excited state, whereby an electron is donated from the catalyst to a substrate. Excited state reduction potential may be estimated by the following equation:

$$E_{1/2}^* = E^{ox} - E_{0,0}$$

where $E_{0,0}$ is estimated from the catalyst's emission onset in the following equation:

$$E_{0,0} = h \times c/\lambda_{onset}$$

where h is Planck's constant and c is the speed of light. In one embodiment, the catalyst that is reducing in an excited state stabilizes the radical cation species in an excited state.

For example, in certain embodiments, the organic photoredox catalyst may be selected from a phenothiazine derivative, a phenoxazine derivative, a 9,10-dihydroacridine derivative, a carbazole derivative, aryl amine derivatives, diaryl amine derivatives, triaryl amine derivatives, and large pi-extended all carbon derivate such as, but not limited to, rubrene, pyrene graphene, and carbon nanotubes.

In certain other embodiments (e.g., Embodiment 1), the organic photoredox catalyst has the formula A-Z, wherein each A is independently:

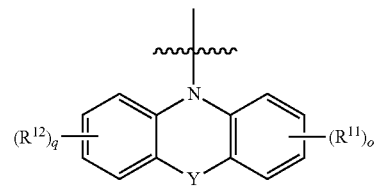

wherein
each Y is independently a bond, O, S, $NR^{14}$, or $C(R^{14})_2$;
o and q are independently zero or an integer of 1 to 4;
$R^{11}$ and $R^{12}$ are independently selected from the group consisting of: halogen, cyano, hydroxy, amino, mono or di($C_1$-$C_{20}$)alkylamino, mono or diarylamino, $C_1$-$C_6$ alkyl, halo($C_1$-$C_6$)alkyl, $C_1$-$C_6$ alkoxy, halo($C_1$-$C_6$)alkoxy, $C_3$-$C_7$ cycloalkyl, aryl, aryloxy, alkoxyaryl, and heteroaryl, wherein each alkyl, cycloalkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy;
each $R^{14}$ is independently hydrogen, $C_1$-$C_6$ alkyl, aryl, or aryl($C_1$-$C_6$ alkyl), wherein each alkyl and aryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy; and each Z is $R^{13}$, —B-(A)$_2$, —B—($R^{13}$)$_2$, —B(A)($R^{13}$), —N-(A)$_2$, —N—($R^{13}$)$_2$, —N(A)($R^{13}$), —Si—($R^{13}$)$_3$, —Si(A)$_3$, —Si(A)$_2$($R^{13}$), —Si(A)($R^{13}$)$_2$, —P-(A)$_2$, —P—($R^{13}$)$_2$, —P($R^{13}$)(A), —P(O)—(O$R^{13}$)$_2$, —P(O)—($R^{13}$)$_2$, —P(O)—($R^{13}$)(A), or —P(O)-(A)$_2$, wherein $R^{13}$ is H, $C_1$-$C_{20}$ alkyl, —C(O)$C_1$-$C_{20}$ alkyl, $C_3$-$C_7$ cycloalkyl, aryl, aryl($C_1$-$C_6$ alkyl), heteroaryl, or heteroaryl ($C_1$-$C_6$ alkyl), wherein each alkyl, cycloalkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, halo($C_1$-$C_6$)alkoxy, $C_3$-$C_7$ cycloalkyl, aryl, aryloxy, alkoxyaryl, heteroaryl, heteroaryloxy, or group A.

Embodiment 2 encompasses photoredox catalysts of Embodiment 1 wherein each Z is $R^{13}$, —B-(A)$_2$, —B—($R^{13}$)$_2$, —B(A)($R^{13}$), —N-(A)$_2$, —N—($R^{13}$)$_2$, —N(A)($R^{13}$), —Si—($R^{13}$)$_3$, —Si(A)$_3$, —Si(A)$_2$($R^{13}$), or —Si(A)($R^{13}$)$_2$. Particularly in Embodiment 2, each Z is $R^{13}$, —B—($R^{13}$)$_2$, —N—($R^{13}$)$_2$, or —Si—($R^{13}$)$_3$. Particularly in Embodiment 2, each Z is $R^{13}$, —B-(A)$_2$, —B(A)($R^{13}$), —N-(A)$_2$, —N(A)($R^{13}$), —Si(A)$_3$, —Si(A)$_2$($R^{13}$), or —Si(A)($R^{13}$)$_2$. Particularly in Embodiment 2, each Z is $R^{13}$, —B-(A)$_2$, —B—($R^{13}$)$_2$, —N-(A)$_2$, —N—($R^{13}$)$_2$, —Si—($R^{13}$)$_3$, or —Si(A)($R^{13}$)$_2$. Embodiment 3 encompasses photoredox catalysts of Embodiment 1 wherein each Z is $R^{13}$, —B-(A)$_2$, —B—($R^{13}$)$_2$, —B(A)($R^{13}$), —N-(A)$_2$, —N—($R^{13}$)$_2$, or —N(A)($R^{13}$). Particularly in Embodiment 3, each Z is $R^{13}$, —B-(A)$_2$, —B—($R^{13}$)$_2$, —N-(A)$_2$, or —N—($R^{13}$)$_2$. Embodiment 4 encompasses photoredox catalysts of Embodiment 1 wherein each Z is —Si—($R^{13}$)$_3$, —Si(A)$_3$, —Si(A)$_2$($R^{13}$), —Si(A)($R^{13}$)$_2$, —P-(A)$_2$, —P—($R^{13}$)$_2$, —P($R^{13}$)(A), —P(O)—(O$R^{13}$)$_2$, —P(O)—($R^{13}$)$_2$, —P(O)—($R^{13}$)(A), or —P(O)-(A)$_2$. Particularly in Embodiment 4, each Z is —Si—($R^{13}$)$_3$, —P—($R^{13}$)$_2$, —P(O)—(O$R^{13}$)$_2$, or —P(O)—($R^{13}$)$_2$. Particularly in Embodiment 4, each Z is —Si(A)$_3$, —Si(A)$_2$($R^{13}$), —Si(A)($R^{13}$)$_2$, —P-(A)$_2$, —P($R^{13}$)(A), or —P(O)—(O$R^{13}$)$_2$. In embodiment 5, the disclosure provides photoredox catalysts of Embodiment 1 wherein each Z is —Si—($R^{13}$)$_3$, —Si(A)$_3$, —Si(A)$_2$($R^{13}$), or —Si(A)($R^{13}$)$_2$. In embodiment 6, the disclosure provides photoredox catalysts of Embodiment 1 wherein each Z is —P-(A)$_2$, —P—($R^{13}$)$_2$, —P($R^{13}$)(A), —P(O)—(O$R^{13}$)$_2$, —P(O)—($R^{13}$)$_2$, —P(O)—($R^{13}$)(A), or —P(O)-(A)$_2$. Embodiment 7 encompasses photoredox catalysts of Embodiment 1 wherein each Z is $R^{13}$, —B-(A)$_2$, or —B—($R^{13}$)$_2$. Particularly in Embodiment 7, each Z is $R^{13}$ or —B-(A)$_2$.

In Embodiment 8 of the disclosure, the photoredox catalyst useful in the methods of the disclosure is wherein Z is $R^{13}$, and such compounds are represented by formula:

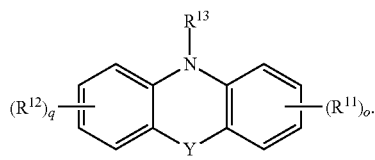

Particular compounds of Embodiment 8 include those of Embodiment 9, i.e., the photoredox catalyst where Y is O, S, $NR^{14}$, or $C(R^{14})_2$. In embodiment 10, the disclosure provides photoredox catalysts of Embodiment 8 or 9 wherein Y is O, S, or $NR^{14}$. In embodiment 11, the disclosure provides photoredox catalysts of Embodiment 8 or 9 wherein Y is O or S. In embodiment 12, the disclosure provides photoredox catalysts of Embodiment 8 or 9 wherein Y is S. In embodiment 13, the disclosure provides photoredox catalysts of Embodiment 8 or 9 wherein Y is $C(R^{14})_2$. Embodiment 14 encompasses photoredox catalysts of Embodiment 8 wherein Y is absent.

Embodiment 15 encompasses photoredox catalysts of any one of Embodiments 8-14 wherein o and q are independently 0.

In embodiment 16, the disclosure provides photoredox catalysts of any one of Embodiments 8-14 wherein at least one of o and q is 1. Embodiment 17 encompasses photoredox catalysts of Embodiment 16 wherein $R^{11}$ and $R^{12}$ are independently selected from the group consisting of: hydrogen, halogen, cyano, hydroxy, amino, mono or di($C_1$-$C_{20}$) alkylamino, $C_1$-$C_6$ alkyl, and $C_1$-$C_6$ alkoxy. Particularly in Embodiment 17, $R^{11}$ and $R^{12}$ are independently selected from the group consisting of: hydrogen, halogen, hydroxy, amino, mono or di($C_1$-$C_{20}$)alkylamino, $C_1$-$C_6$ alkyl, and $C_1$-$C_6$ alkoxy.

Particular embodiments based on Embodiments 8-17 include those of Embodiment 18, i.e., photoredox catalysts wherein $R^{13}$ is $C_1$-$C_{20}$ alkyl, —C(O)$C_1$-$C_{20}$ alkyl, $C_3$-$C_7$ cycloalkyl, aryl, aryl($C_1$-$C_6$ alkyl), heteroaryl, or heteroaryl ($C_1$-$C_6$ alkyl), wherein each alkyl, cycloalkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy. Particularly in Embodiment 18, $R^{13}$ is $C_1$-$C_{20}$ alkyl, $C_3$-$C_7$ cycloalkyl, aryl, aryl($C_1$-$C_6$ alkyl), heteroaryl, or heteroaryl ($C_1$-$C_6$ alkyl), wherein each alkyl, cycloalkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy.

Particular embodiments based on Embodiments 8-17 include those of Embodiment 19, i.e., photoredox catalysts wherein $R^{13}$ is $C_1$-$C_{20}$ alkyl, aryl, aryl($C_1$-$C_6$ alkyl), heteroaryl, or heteroaryl($C_1$-$C_6$ alkyl), wherein each alkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy.

Particular embodiments based on Embodiments 8-17 include those of Embodiment 20, i.e., photoredox catalysts wherein $R^{13}$ is $C_1$-$C_{20}$ alkyl, aryl, or aryl($C_1$-$C_6$ alkyl), wherein each alkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo ($C_1$-$C_6$)alkoxy.

Other particular embodiments based on Embodiments 8-17 include those of Embodiment 21, i.e., photoredox catalysts wherein $R^{13}$ is $C_1$-$C_{20}$ alkyl or aryl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo ($C_1$-$C_6$)alkoxy.

Some other particular embodiments based on Embodiments 8-17 include those of Embodiment 22, i.e., photoredox catalysts wherein $R^{13}$ is $C_1$-$C_6$ alkyl or aryl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy.

In embodiment 23, the disclosure provides photoredox catalysts of any one of Embodiments 8-17 wherein $R^{13}$ is $C_1$-$C_4$ alkyl or phenyl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy. Particularly in Embodiment 23, $R^{13}$ is methyl, phenyl, or 2-, 3-, or 4-(trifluoromethyl)phenyl.

Other particular embodiments based on Embodiments 8-17 include those of Embodiment 24, i.e., photoredox catalysts wherein $R^{13}$ is H, $C_1$-$C_{20}$ alkyl, or aryl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy.

Another embodiment of the disclosure, i.e., Embodiment 25, encompasses photoredox catalysts of Embodiment 8 wherein Y is O or S;
o and q are independently an integer of 0, 1 or 2;
$R^{11}$ and $R^{12}$ are independently selected from the group consisting of: hydrogen, halogen, cyano, hydroxy, amino, mono or di($C_1$-$C_{20}$)alkylamino, $C_1$-$C_6$ alkyl, $C_1$-$C_6$ alkoxy, $C_3$-$C_7$ cycloalkyl, aryl, or heteroaryl, wherein each alkyl, cycloalkyl, aryl, and heteroaryl group is optionally substituted with from 1-4 groups that are independently $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, or halo($C_1$-$C_6$) alkoxy; and
$R^{13}$ is $C_1$-$C_6$ alkyl or aryl, each optionally substituted with from 1-4 groups that are independently $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, or halo($C_1$-$C_6$)alkoxy.

In embodiment 26, the photoredox catalysts of Embodiments 25 wherein Y is S.

Another embodiment of the disclosure, i.e., Embodiment 27, provides photoredox catalyst that is:

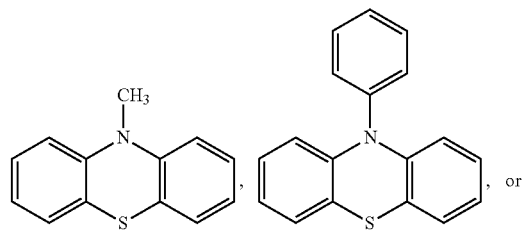
,
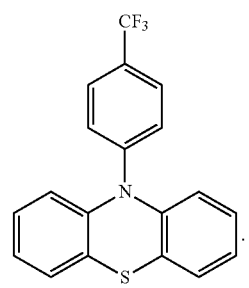

, or

.

In Embodiment 28 of the disclosure, the photoredox catalyst useful in the methods of the disclosure is wherein Z is —B-(A)$_2$, and such compounds are represented by formula:

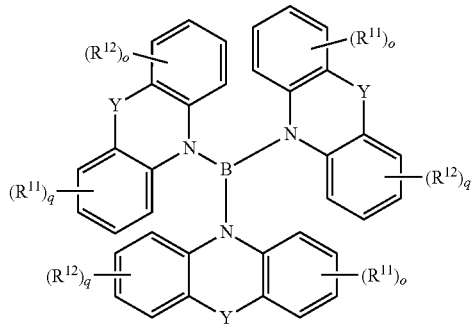

Particular compounds of Embodiment 28 include those of Embodiment 29, i.e., the photoredox catalyst where Y is O, S, $NR^{14}$, or $C(R^{14})_2$. In embodiment 30, the disclosure provides photoredox catalysts of Embodiment 28 or 29 wherein Y is O, S, or $NR^{14}$. In embodiment 31, the disclosure provides photoredox catalysts of Embodiment 28 or 29 wherein Y is O or S. In embodiment 32, the disclosure provides photoredox catalysts of Embodiment 28 or 29 wherein Y is S. In embodiment 33, the disclosure provides photoredox catalysts of Embodiment 28 or 29 wherein Y is $C(R^{14})_2$. Embodiment 34 encompasses photoredox catalysts of Embodiment 28 wherein Y is absent.

Embodiment 35 encompasses photoredox catalysts of any one of Embodiments 28-34 wherein o and q are independently 0.

In embodiment 36, the disclosure provides photoredox catalysts of any one of Embodiments 28-34 wherein at least one of o and q is 1. Embodiment 37 encompasses photoredox catalysts of Embodiment 26 wherein $R^{11}$ and $R^{12}$ are independently selected from the group consisting of: hydrogen, halogen, cyano, hydroxy, amino, mono or di($C_1$-$C_{20}$) alkylamino, $C_1$-$C_6$ alkyl, and $C_1$-$C_6$ alkoxy. Particularly in Embodiment 37, $R^{11}$ and $R^{12}$ are independently selected from the group consisting of: hydrogen, halogen, hydroxy, amino, mono or di($C_1$-$C_{20}$)alkylamino, $C_1$-$C_6$ alkyl, and $C_1$-$C_6$ alkoxy.

Another embodiment of the disclosure, i.e., Embodiment 38, encompasses photoredox catalysts of Embodiment 28 wherein Y is O or S; o and q are independently an integer of 0, 1 or 2; and $R^{11}$ and $R^{12}$ are independently selected from the group consisting of: hydrogen, halogen, cyano, hydroxy, amino, mono or di($C_1$-$C_{20}$)alkylamino, $C_1$-$C_6$ alkyl, $C_1$-$C_6$ alkoxy, $C_3$-$C_7$ cycloalkyl, aryl, or heteroaryl, wherein each alkyl, cycloalkyl, aryl, and heteroaryl group is optionally substituted with from 1-4 groups that are independently $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, or halo($C_1$-$C_6$) alkoxy. In embodiment 39, the photoredox catalysts of Embodiments 38 wherein Y is S.

Another embodiment of the disclosure, i.e., Embodiment 40, provides photoredox catalyst that is:

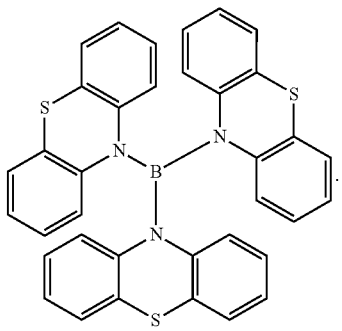 [SMILES: c1ccc2c(c1)Sc1ccccc1N2B(N1c2ccccc2Sc2ccccc21)N1c2ccccc2Sc2ccccc21]

Particular compounds of Embodiment 41 include those of any one of Embodiments 1-7, i.e., the photoredox catalyst where Y is O, S, $NR^{14}$, or $C(R^{14})_2$. In embodiment 42, the disclosure provides photoredox catalysts of any one of Embodiments 1-7 wherein Y is O, S, or $NR^{14}$. In embodiment 43, the disclosure provides photoredox catalysts of any one of Embodiments 1-7 wherein Y is O or S. In embodiment 44, the disclosure provides photoredox catalysts of any one of Embodiments 1-7 wherein Y is S. In embodiment 45, the disclosure provides photoredox catalysts of any one of Embodiments 1-7 wherein Y is $C(R^{14})_2$. Embodiment 46 encompasses photoredox catalysts of any one of Embodiments 1-7 wherein Y is absent.

Embodiment 46 encompasses photoredox catalysts of any one of Embodiments 1-7 wherein o and q are independently 0.

In embodiment 47, the disclosure provides photoredox catalysts of any one of Embodiments 1-7 wherein at least one of o and q is 1. Embodiment 48 encompasses photoredox catalysts of Embodiment 47 wherein $R^{11}$ and $R^{12}$ are independently selected from the group consisting of: hydrogen, halogen, cyano, hydroxy, amino, mono or di($C_1$-$C_{20}$) alkylamino, $C_1$-$C_6$ alkyl, and $C_1$-$C_6$ alkoxy. Particularly in Embodiment 48, $R^{11}$ and $R^{12}$ are independently selected from the group consisting of: hydrogen, halogen, hydroxy, amino, mono or di($C_1$-$C_{20}$)alkylamino, $C_1$-$C_6$ alkyl, and $C_1$-$C_6$ alkoxy.

Particular embodiments based on Embodiments 1-7 and 41-48 include those of Embodiment 49, i.e., photoredox catalysts wherein $R^{13}$, if present, is $C_1$-$C_{20}$ alkyl, aryl, aryl($C_1$-$C_6$ alkyl), heteroaryl, or heteroaryl($C_1$-$C_6$ alkyl), wherein each alkyl, aryl, and heteroaryl group is optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy. Other particular embodiments based on Embodiments 1-7 and 41-48 include those of Embodiment 50, i.e., photoredox catalysts wherein $R^{13}$ is $C_1$-$C_{20}$ alkyl or aryl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy. Some other particular embodiments based on Embodiments 1-7 and 41-48 include those of Embodiment 51, i.e., photoredox catalysts wherein $R^{13}$ is $C_1$-$C_6$ alkyl or aryl, each optionally substituted with one or more groups independently selected from $C_1$-$C_6$ alkyl, $C_1$-$C_6$ alkoxy, halogen, hydroxy, amino, mono- or di-($C_1$-$C_6$) alkylamino, halo($C_1$-$C_6$)alkyl, and halo($C_1$-$C_6$)alkoxy. Embodiment 52 provides photoredox catalysts of Embodiment 51, wherein $R^{13}$ is methyl, phenyl, or 2-, 3-, or 4-(trifluoromethyl)phenyl.

As is understood by one of skill in the art, any the photoredox catalyst described above may be used in methods of the disclosure.

The methods described herein can be operated at relatively low photoredox catalyst levels. Thus, the methods described herein can be performed with significantly lower costs while maintaining good monomer conversion and reaction rates during the polymerization. For example, in certain embodiments, the photoredox catalyst is present at about 0.00001 mol % to about 20 mol % relative to the amount of monomer used. In one embodiment, the methods of the disclosure operate at about 0.005 mol % to about 20 mol % of the photoredox catalyst relative to the amount of monomer used. In certain such embodiments, the photoredox catalyst is present at about 0.005 mol % to about 20 mol %, or 0.005 mol % to about 15 mol %, or 0.005 mol % to about 10 mol %, or 0.005 mol % to about 7.5 mol %, or 0.005 mol % to about 5 mol %, or 0.01 mol % to about 20 mol %, or 0.01 mol % to about 15 mol %, or 0.01 mol % to about 10 mol %, or 0.01 mol % to about 7.5 mol %, or 0.01 mol % to about 5 mol %, or 0.01 mol % to about 4 mol %, or 0.01 mol % to about 3 mol %, or 0.01 mol % to about 2 mol %, or 0.01 mol % to about 1 mol %, or 0.01 mol % to about 0.9 mol %, or 0.01 mol % to about 0.8 mol %, or 0.01 mol % to about 0.7 mol %, or 0.01 mol % to about 0.6 mol %, or 0.01 mol % to about 0.5 mol %, or 0.01 mol % to about 0.4 mol %, or 0.01 mol % to about 0.3 mol %, or 0.01 mol % to about 0.2 mol %, or 0.01 mol % to about 0.1 mol %, or 0.005 mol % to about 0.1 mol %, or 0.01 mol % to about 0.07 mol %, or 0.03 mol % to about 0.07 mol %, or 0.04 mol % to about 0.06 mol % of the photoredox catalyst relative to the amount of monomer used. In some embodiments, the photoredox catalyst is present at about 0.01 mol % to about 0.1 mol %. In some embodiments, the photoredox catalyst is present at about 0.05 mol % to about 0.5 mol %. In some embodiments, the photoredox catalyst is present at about 0.5 mol % to about 1.0 mol %. In other embodiments, the photoredox catalyst is present at about 0.5 mol %. Of course, the person of ordinary skill in the art will understand that in certain embodiments and applications, the amounts of photoredox catalyst used may differ from those particularly described here.

The methods of the disclosure may be carried out in a solvent-free system to obtain a reaction mixture.

The methods of the disclosure may be carried out in a solvent system to obtain a reaction mixture; and polymerizing the monomers by irradiating the reaction mixture with a light source. As the person of ordinary skill in the art will appreciate, the methods of the disclosure may be carried out in any suitable solvent, depending on the desired need. In one instance the solvent is a reactive solvent, for example, a monomer, for example, methyl methacrylate. Embodiments of the invention can be adapted for use with a variety of solvents known in the art, for example dimethyl formamide (DMF), toluene, 1,4-dioxane, xylenes, anisole, dimethyl sulfoxide (DMSO), N,N-dimethylacetamide (DMA), tetrahydrofuran (THF), water, methanol, ethanol, acetonitrile, N-methylpyrrolidone, chlorobenzene, dichlorobenzene, trichlorobenzene, methylene chloride, acetone, benzene, cyclohexane, hexanes, ethyl acetate, diethyl ether, 1,2-dichloroethane, chloroform and the like.

In addition, in some embodiments of the invention, one or more reactants in the polymerization process (e.g. a monomer) functions a solvent.

In some embodiments, the methods may be carried out in solvent system comprising N,N-dimethylacetamide (DMA) to afford excellent control of the polymerization. One of skill in the art will recognize that DMA may be used neat or may be mixed with one or more additional solvents. These additional solvents include, but are not limited to, dimethyl formamide (DMF), toluene, 1,4-dioxane, xylene, anisole, dimethyl sulfoxide (DMSO), tetrahydrofuran (THF), water, methanol, acetonitrile, chloroform and the like. When DMA is mixed with one or more of additional solvents, the solvent system comprising DMA comprises more than about 10 vol % of DMA, or more than about 25 vol % of DMA, or more than about 50 vol % of DMA, or more than about 60 vol % of DMA, or more than about 70 vol % of DMA, or more than about 80 vol % of DMA, or more than about 90 vol % of DMA, or more than about 95 vol % of DMA, or more than about 98 vol % of DMA, or more than about 99 vol % of DMA based on the total volume of solvent. In one embodiment of the methods of the disclosure, the solvent system consists essentially of DMA. In one embodiment, DMA used in the methods of the disclosure is not mixed with any other solvent. Thus, in some embodiments of the methods of the disclosure, the solvent system consists of DMA.

As the person of ordinary skill in the art will appreciate, the methods of the disclosure may be carried out in any suitable concentration of the monomer in the reaction mixture. For example, the reaction mixture may be at a concentration of at least about 1.0 M. of the monomer in the reaction mixture. One of skill in the art will appreciate that the upper limit will depend on the particular monomer used and whether a solvent is present, but will be no lower than about 1.0 M, or 1.5 M, or 2.0 M, or 3.0 M, or 4.0 M, or 5.0 M concentration of the monomer in the reaction mixture when a solvent is present.

An initiator compound of the disclosure reacts with a monomer in a radical polymerization process to form an intermediate compound capable of linking successively with additional monomer to form a crosslinked polymer. Generally, organic halides may be used as initiators in methods of the disclosure. For example, alkyl halides and pseudo halides may be used. Suitable alkyl halides include alkyl bromides and alkyl chlorides. Initiators other than alkyl halide or pseudo halide that can be used in embodiments of the disclosure include, but are not limited to, allyl halides, xanthates, thioesters, thionoesters, dithioesters, trithiocarbonates, and nitroxides. In some embodiments of the disclosure, the shape or structure of an initiator can be selected to influence the architecture of a polymer. For example, initiators with multiple alkyl halide groups on a single core can lead to a star-like polymer shape. Additionally, suitable initiator may be chosen based on the specific end-functionality of the polymer desired. For example, the initiator suitable for the methods of the disclosure may contain a reactive functional group such as, but not limited to, carboxy, phthalimido, cyano, N-hydroxysuccinimide ester, pentafluorophenyl ester, etc. The initiator suitable for the methods of the disclosure may be optionally conjugated to a substrate, such as a silicon substrate. Examples of initiators suitable for use in the methods of the disclosure include, but are not limited to:

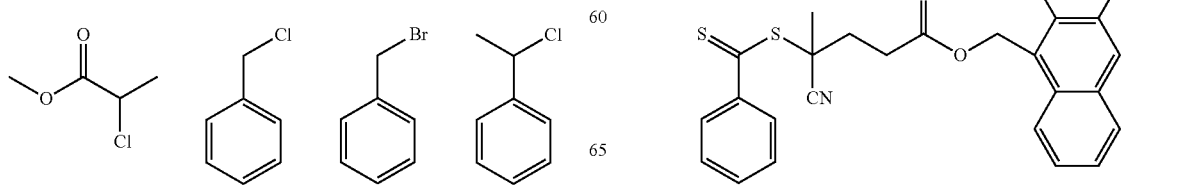

-continued

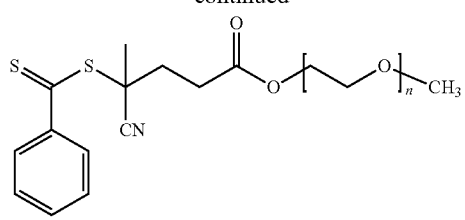
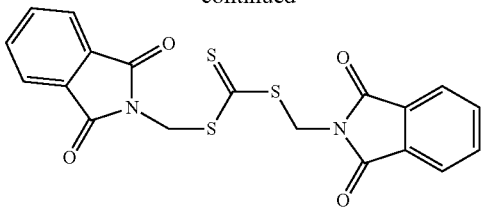
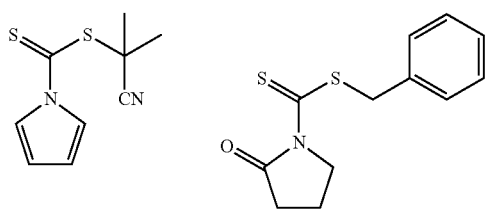
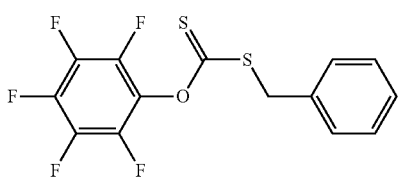
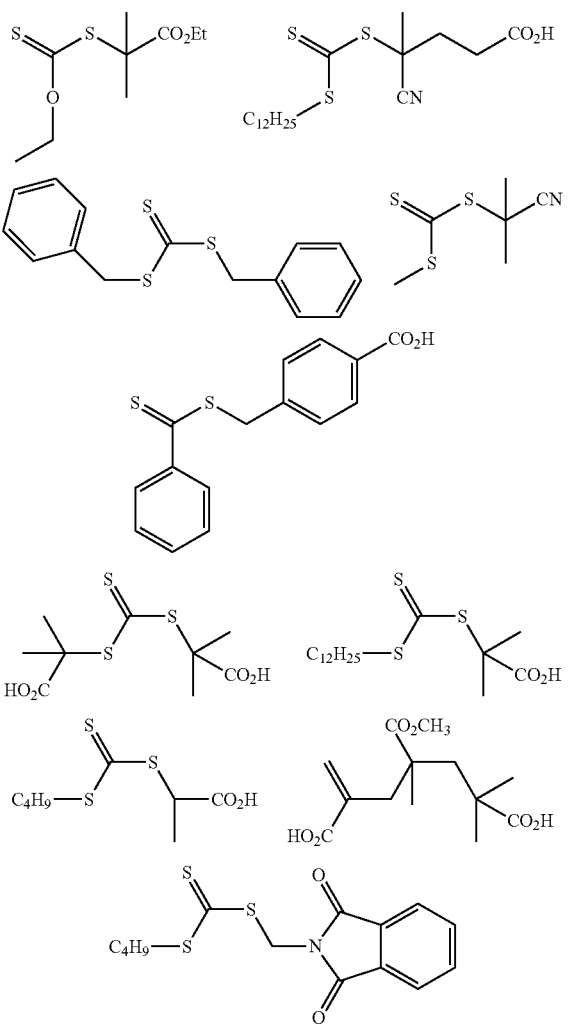

In one embodiment, the initiator suitable for use in the methods of the disclosure is ethyl 2-bromopropanoate, benzyl 2-bromopropanoate, ethyl α-bromoisobutyrate, or benzyl α-bromoisobutyrate. In another embodiment, the initiator is ethyl 2-bromopropanoate or benzyl 2-bromopropanoate. In yet another embodiment, the initiator is ethyl 2-bromopropanoate. In yet another embodiment, the initiator is benzyl 2-bromopropanoate.

A polymerizable moiety is defined as a fragment of a molecule capable of undergoing reaction with an initiator and/or catalyst to form a reactive entity capable of interacting with another polymerizable moiety on the same or a different molecule. This process, repeated iteratively, can be used to link a multitude of molecules containing polymerizable moieties into chains or networks.

As is known in the art, monomers encompass a class of compounds, mostly organic, that contain one or more polymerizable moiety that can react with a polymerizable moiety of another molecules of the same or other compound to form very large molecules, or polymers, or polymer networks. In one instance, the monomer is a polyfunctional monomer or prepolymer. Monomers that are typically used in radical polymerization reactions include molecules with substituents that can stabilize the propagating radicals. The methods described herein may be performed using, for example, (meth)acrylate, (meth)acrylamide, (meth)acrylonitrile, styrene, vinyl acetate, vinylpyridine, and vinyl chloride monomers available to one skilled in the art, and may be varied depending on the desired product. Monomers that undergo radical polymerization in the disclosed methods include but are not limited to typical alkene monomers that undergo traditional radical polymerization. Examples include, but not limited to, alkyl methacrylates (e.g., methyl methacrylate), acrylates (including various alkyl acrylates), styrenes, methacrylic acid, acrylic acid, benzyl methacrylate, benzyl acrylate, acrylamide, alkylacrylamide, dialkyl acrylamide (e.g., N,N-dimethylacrylamide), methacrylamide, alkyl methacrylamide, dialkyl methacrylamide, acrylonitrile, methacrylonitrile, vinyl acetate, vinylpyridine, vinyl chloride, acrylamides, etc. The monomers may be further functionalized with one or more of reactive functional groups, which include, but are not limited to, carboxylic acids, amines, amides, alcohols, ketones, aldehydes, alkynes, fluorides, chlorides, bromides, iodides, ethers, esters, hydroxylamines, imines, azides, nitriles, isocyanates, isocyanides, nitrites, nitrosos, thiols, thioethers, sulfoxides, sulfonic acids, thiocyanates, isothiocyanates, thiones, thials, phosphines, phosphonic acids, phosphates, boronic acid, boronic esters, borinic acids, hetroaromatics, and heterocycles.

The methods described herein may be performed using polyfunctional monomers. A polyfunctional monomer is a class of monomer with two or more polymerizable moieties that can react with other polymerizable moieties of the same monomer or another monomer to form very large molecules, polymers, or polymer networks. The polyfunctional monomer can be described by a functional group equivalent weight (FGEW), where the functional group equivalent weight is governed by the following equation:

$$FGEW = \frac{\text{Total Molecular Weight of Polyfunctional Monomer}}{\text{Number of Polymerizable Moieties in Polyfunctional Monomer}}$$

The methods described herein may be performed using, for example, monomers containing two or more (meth) acrylate, (meth)acrylamide, (meth)acrylonitrile, styrene, vinyl acetate, vinylpyridine, and vinyl chloride functional groups, and may be varied depending on the desired product. Examples of polyfunctional monomers include, but are not limited to, dipentaerythritol penta-/hexa-(meth)acrylate, pentaerythritol tetra(meth)acrylate, di(trimethylolpropane) tetra(meth)acrylate, trimethylolpropane tri(meth)acrylate, pentaerythritol tri(meth)acrylate, trimethylolpropane propoxylate tri(meth)acrylate, trimethylolpropane ethoxylate tri(meth)acrylate, poly(ethylene glycol) di(meth)acrylate, poly(propylene glycol) di(meth)acrylate, and 1,4-butanediol di(meth)acrylate.

Polyfunctional monomers are defined as those species with a FGEW range from 26 up to 300, or, in some embodiments, up to 50,000, or in some embodiments up to 100,000.

The methods described herein may be performed using polyfunctional prepolymers. Polyfunctional prepolymers are defined as materials containing two or more polymerizable moieties and/or initiators. Polyfunctional prepolymers are prepared via reaction of one or more monomers, polyfunctional monomers, or combinations thereof to a molecular weight greater than that of the original monomers or polyfunctional monomers. In one instance, the initiator is incorporated as part of polyfunctional prepolymer. As known to one skilled in the art, the presence of polymerizable moieties and/or initiators enable polymerization reactivity of polyfunctional prepolymers. Commonly, prepolymer materials can have a FGEWs from 300 to 1,000,000, up to 2,000,000.

The methods of the disclosure allow precise control of polymer growth so as to form polymers having selected lengths and/or selected molecular weights (e.g. within selected MW ranges) and/or selected molecular weight distributions and/or selected architectures. In certain embodiments of the disclosure, polymer chains have a structure selected from a group consisting of; random copolymers; statistical polymers; linear polymers; branched polymers; star polymers; brush polymers; comb polymers; graft polymers, and cyclic polymers. In one embodiment, the polymers are formed from at least two or more monomers. In some other embodiments, the polymer prepared by the methods of the disclosure is comprised of the same monomer.

The rate of polymer formation is directly proportional to the amount of light exposure in embodiments of the disclosed methods. Monomer conversion in a reaction mixture is regulated by controlling an amount of time that the reaction mixture is exposed to light; and/or by controlling the intensity of light that reaches the reaction mixture. Embodiments of the invention can comprise exposing a reaction mixture to light multiple times in order to precisely tailor one or more characteristics of a polymer composition. For example, in some methods of the disclosure, a reaction mixture is first exposed to light for a period of time so that the radical polymerization process is activated; followed by period of time during which this reaction mixture is protected from light exposure so that the radical polymerization process is deactivated; and then re-exposing the reaction mixture to light for a period of time so that the radical polymerization process is re-activated, etc. One of skill in the art will appreciate that a light source may be one of the wide varieties of optical sources known in the art.

In addition to removing the light source, one of skill in the art will recognize that the polymerization may be discontinuing by any method known in the art. For example, the polymerization may be discontinued by addition of a quenching reagent known in the art. In this embodiment, the light source may or may not be still present. Finally, one of skill in the art will recognize that the polymerization might be discontinued upon exhausting the monomers available for the reaction.

As noted above, the methods of the disclosure may be used to prepare a polymer which is used in additive manufacturing. The structure of the polymer depends on the monomers used and the reaction conditions selected.

The reaction mixture viscosity should be 1 cP for some applications, to 1000 cP in some applications. Still, in some applications, very high viscosities are necessary (100,000 to 1,500,000 cP). As is known to one skilled in the art, the viscosity of the reaction mixture is dependent on both the molecular weight and molecular structure of the components of the reaction mixture. Also, one skilled in the art would know that reaction mixture viscosity and temperature are related functions, and that changing temperature will affect the viscosity of the reaction mixture. Judicious selection of one or more monomers and/or polyfunctional monomers and/or polyfunctional prepolymers would allow for preparation of a reaction mixture having an appropriate viscosity at a given temperature for an application.

Further, the reaction mixture FGEW can be selected to afford a material that undergoes crosslinking reactions at a rate suitable for the desired application. As is known to one skilled in the art, a system comprised of polyfunctional monomers or polyfunctional prepolymers with more reactive functionalities per molecule (a lower FGEW) will crosslink at a faster rate than a system comprised of polyfunctional monomers or polyfunctional prepolymers of the same molecular weight but containing fewer reactive functionalities (a higher FGEW). Thus, one skilled in the art would be able to select one or more monomers and/or polyfunctional monomers and/or polyfunctional prepolymers to obtain a reaction mixture with an overall FGEW that will afford a crosslinked network that forms at a rate appropriate for the desired application.

A reaction mixture useful for fabricating a three dimensional object could contain one or more monomers, and/or one or more polyfunctional monomers, and/or one or more polyfunctional prepolymers. In another embodiment, a reaction mixture could also contain a photocatalyst. In another embodiment, a reaction mixture could also contain an initiator. In one embodiment, the reaction mixture contains one or more monomers, and/or one or more polyfunctional monomers, and/or one or more polyfunctional prepolymers and a photocatalyst. In one embodiment, the reaction mixture contains one or more monomers, and/or one or more polyfunctional monomers, and/or one or more polyfunctional prepolymers and an initiator. In one embodiment, the reaction mixture contains one or more monomers, and/or one or more polyfunctional monomers, and/or one or more polyfunctional prepolymers and a photocatalyst and an initiator.

A reaction mixture useful for a fabricating a three dimensional object should undergo rapid polymerization to form a crosslinked polymer network. In some embodiments, the reaction mixture should obtain a high viscosity (>1000 cP, more ideally, >10000 cP, even more ideally, >100,000 cP) within 30 seconds of irradiation, or, more ideally, within 20 seconds of irradiation, or, more ideally, within 10 seconds of irradiation, or more ideally, <1 second of irradiation.

The material properties of the resulting polymer or polymer network will be suitable for the given application.

In one instance, the reaction mixture described herein is used in a method to fabricate a three dimensional object, the method comprising: (a) combining one or more meth(acrylate), (meth)acrylamide, (meth)acrylonitrile, styrene, acrylonitrile, vinyl acetate, vinylcarbazole, vinylpyridine, vinyl ether, or vinyl chloride monomers or polyfunctional monomers or polyfunctional prepolymers with an organic photoredox catalyst to provide a reaction mixture; (b) depositing the reaction mixture; (c) polymerizing the monomers by irradiating the reaction mixture with a light source; and (d) repeating the depositing step until the three-dimensional object is formed. In one instance, the method described is performed using additive manufacturing techniques, for example, using a three-dimensional printer.

In one instance, the reaction mixture described herein is used in a method to fabricate a three dimensional object, the method comprising: (a) combining one or more meth(acrylate), (meth)acrylamide, (meth)acrylonitrile, styrene, acrylonitrile, vinyl acetate, vinylcarbazole, vinylpyridine, vinyl ether, or vinyl chloride monomers with an initiator and an organic photoredox catalyst to provide a reaction mixture; (b) depositing the reaction mixture; (c) polymerizing the monomers by irradiating the reaction mixture with a light source; and (d) repeating the depositing step until the three-dimensional object is formed. In one instance, the method described is performed using additive manufacturing techniques, for example, using a three-dimensional printer.

In one instance, the reaction mixture described herein is used in a method to fabricate a three dimensional object, the method comprising: (a) combining one or more meth(acrylate), (meth)acrylamide, (meth)acrylonitrile, styrene, acrylonitrile, vinyl acetate, vinylcarbazole, vinylpyridine, vinyl ether, or vinyl chloride monomers with an initiator to provide a reaction mixture; (b) depositing the reaction mixture; (c) polymerizing the monomers by irradiating the reaction mixture with a light source; and (d) repeating the depositing step until the three-dimensional object is formed. In one instance, the method described is performed using additive manufacturing techniques, for example, using a three-dimensional printer.

EXAMPLES

Materials and Methods. A penta-/hexa-acrylate polyfunctional monomer, dipentaerythritol penta-/hexa-acrylate (with ≤650 ppm monomethyl ether hydroquinone inhibitor), a triacrylate polyfunctional monomer, trimethylolpropane triacrylate (technical grade, with 600 ppm monomethyl ether hydroquinone inhibitor), and initiator ethyl α-bromophenylacetate (97%) are obtained from Aldrich Chemical Company, and used as specified. Reactions are performed under irradiation from a UV lamp (350 nm wavelength). Reactions are determined to be complete when the deposited reaction mixture obtained "tack free" status, where "tack free" is determined as the time point at which a metal spatula tip is touched to the surface of the reaction mixture and removed without any transfer of reaction mixture to the spatula.

Phenylphenothiazine photocatalyst is prepared in a nitrogen filled glovebox: to a vial armed with a magnetic stir bar is added sodium tert-butoxide (0.48 g, Aldrich), phenothiazine (1.00 g, Aldrich, ≥98%), chloro(2-dicyclohexylphosphino-2',6'-diisopropoxy-1,1'-biphenyl)[2-(2'-amino-1,1'-biphenyl)]palladium(II) (0.08 g, RuPhos Palladium Generation 2 Precatalyst, Aldrich), and 2-dicyclohexylphosphino-2',6'-diisopropoxybiphenyl (0.047 g, RuPhos ligand, Aldrich, 95%). The vial is charged with anhydrous dioxane (5 mL, Aldrich), and, lastly, anhydrous chlorobenzene (0.715 mL, Aldrich) is added. The vial is then sealed and placed in a heating block at 110° C. to react for 5 h. After cooling to room temperature, the reaction vial is transferred to a fume hood. The vial top is removed, and the reaction is diluted with methylene chloride (20 mL), washed with deionized water (20 mL), and washed with saturated sodium chloride solution (20 mL). The organic layer is dried with anhydrous magnesium sulfate, and evaporated to dryness. The resulting solid is redissolved in ethyl acetate, mixed with silica, evaporated to dryness, and added to a solid-load chromatography apparatus from TELEDYNE ISCO. The material is subjected to flash chromatography ($SiO_2$ sorbent; Silica 40 g Gold Column from TELEDYNE ISCO; 5% ethyl acetate in hexanes as eluent) on a TELEDYNE ISCO Combiflash automated chromatography purification system, and product containing fractions are isolated and dried to yield phenylphenothiazine photocatalyst as a pale yellow solid (1.00 g, 72% yield).

Example A

In a nitrogen-filled glove box the triacrylate polyfunctional monomer is filtered through neutral alumina to remove inhibitor. A vial is charged with uninhibited triacrylate polyfunctional monomer (0.8 g), followed by addition of initiator (ethyl α-bromophenylacetate, 66 mg), and, lastly, phenylphenothiazine photocatalyst (7 mg). The mixture is stirred until the phenylphenothiazine is coarsely dissolved (some small crystals still visible). A second vial is charged with only the triacrylate polyfunctional monomer and initiator (no photocatalyst). A portion of each of these solutions (0.5 mL) is transferred via syringe to a clean piece of aluminum foil and subjected to irradiation from a UV lamp. The lamp is positioned ~1 inch from the material. After a few seconds (~5-10 seconds) of irradiation, the sample containing catalyst is observed to have a tack-free state. Within 45 seconds, the sample without photocatalyst is observed to have a tack-free state.

Example B

In a nitrogen-filled glove box a first vial is charged with inhibited triacrylate polyfunctional monomer (0.8 g), followed by addition of initiator (ethyl α-bromophenylacetate, 66 mg), and, lastly, phenylphenothiazine photocatalyst (7 mg). The mixture is stirred until the phenylphenothiazine is coarsely dissolved (some small crystals still visible). A second vial is charged with only the triacrylate polyfunctional monomer (0.8 g) and initiator (66 mg) (no photocatalyst). A third vial is charged with only the triacrylate polyfunctional monomer (0.8 g) and photocatalyst (7 mg) (no initiator), and the contents of the vial is stirred until coarsely dissolved. A fourth vial is charged with only the triacrylate polyfunctional monomer (0.8 g) (no initiator and no photocatalyst). A portion of each of these solutions (0.5 mL) is transferred via syringe to a clean piece of aluminum foil and subjected to irradiation from a UV lamp. The lamp is positioned ~1 inch from the material. The time until each reaction reached tack free state is recorded (Table 1).

TABLE 1

| Vial | Polyfunctional Monomer (g) | Photocatalyst (mg) | Initator (mg) | Tack Free Time (seconds) |
|---|---|---|---|---|
| 1 | 0.8 | 7 | 66 | <25 |
| 2 | 0.8 | — | 66 | 61 |
| 3 | 0.8 | 7 | — | 600 |
| 4 | 0.8 | — | — | 3600+ |

Example C

In a nitrogen-filled glove box the penta-/hexa-acrylate polyfunctional monomer is used without removal of inhibitor. Four vials are charged with the penta-/hexa-acrylate polyfunctional monomer, phenylphenothiazine photocatalyst, and initiator (ethyl α-bromophenylacetate) as provided in Table 2.

TABLE 2

| Vial | Polyfunctional Monomer (g) | Photocatalyst (mg) | Initator (mg) | Tack Free Time (seconds) |
|---|---|---|---|---|
| 1 | 0.8 | 4 | 3.7 | 270 |
| 2 | 0.8 | 4 | 7.5 | 225 |
| 3 | 0.8 | 4 | 18.5 | 211 |
| 4 | 0.8 | 4 | 37 | 150 |

Each vial is stirred until the phenylphenothiazine is coarsely dissolved (some small crystals still visible). A portion of each of the contents of each vial (0.5 mL) is transferred via syringe to a clean piece of aluminum foil and subjected to irradiation from a UV lamp (350 nm light). The lamp is positioned ~3 inches from the material. The time to tack free is measured and recorded in Table 2.

Example D

In a nitrogen-filled glove box the penta-/hexa-acrylate polyfunctional monomer is used without removal of inhibitor. Two vials are charged with penta-/hexa-acrylate polyfunctional monomer (1.6 g). To vial 1 is added phenylphenothiazine photocatalyst and initiator (ethyl α-bromophenylacetate) as provided in Table 3. To vial 2 is added only initiator (no photocatalyst) as provided in Table 3.

TABLE 3

| Vial | Photocatalyst (mg) | Initiator (mg) | Tack Free Time (seconds) |
|---|---|---|---|
| 1 | 8 | 3.7 | 10 |
| 2 | — | 3.7 | 110 |

The contents of the vials are stirred, and both samples achieved a homogenous solution (the phenylphenothiazine is fully dissolved in this formulation). A portion of the contents of each vial (0.5 mL) is transferred via syringe to a clean piece of aluminum foil and subjected to irradiation from a UV (350 nm light) thin layer chromatography lamp. The lamp is positioned ~3 inches from the material. The time to "tack free" for the solutions is measured and recorded in Table 3.

What is claimed is:

1. A method of fabricating a three-dimensional object, the method comprising:

(a) combining at least one of a meth(acrylate), a (meth)acrylamide, a (meth)acrylonitrile, a styrene, an acrylonitrile, a vinyl acetate, a vinylcarbazole, a vinylpyridine, a vinyl ether, a vinyl chloride monomers, a polyfunctional monomer, and a polyfunctional prepolymer with phenylphenothiazine and ethyl α-bromophenylacetate to provide a reaction mixture; wherein a weight ratio between the phenylphenothiazine and the ethyl α-bromophenylacetate is from 0.10 to 2.20;

(b) depositing the reaction mixture;

(c) polymerizing the monomers by irradiating the reaction mixture with a light source, wherein polymerization in the reaction mixture is regulated by controlling the amount of time that the reaction mixture is exposed to light; and/or by controlling the intensity of light that reaches the reaction mixture; and (d) repeating steps (b) and (c) until the three-dimensional object is formed.

2. The method of fabricating a three-dimensional object as in claim 1, wherein the monomer is selected from one or more of (meth)acrylate, alkyl (meth)acrylate, (meth)acrylamide, (meth)acrylonitrile, styrene, vinyl acetate, vinylpyridine, vinyl chloride, vinyl ether, alkene monomers, alkyl (meth)acrylates, acrylates, styrenes, (meth)acrylic acid, benzyl (meth)acrylate, alkyl (meth)acrylamide, dialkyl (meth)acrylamide, dipentaerythritol penta-/hexa-(meth)acrylate, pentaerythritol tetra(meth)acrylate, di(trimethylolpropane) tetra(meth)acrylate, trimethylolpropane tri(meth)acrylate, pentaerythritol tri(meth)acrylate, trimethylolpropane propoxylate tri(meth)acrylate, trimethylolpropane ethoxylate tri(meth)acrylate, poly(ethylene glycol) di(meth)acrylate, poly(propylene glycol) di(meth)acrylate, and 1,4-butanediol di(meth)acrylate.

3. The method of fabricating a three-dimensional object as in claim 1 further comprising discontinuing polymerization.

* * * * *